United States Patent [19]

Mogi et al.

[11] 4,250,519
[45] Feb. 10, 1981

[54] SEMICONDUCTOR DEVICES HAVING VMOS TRANSISTORS AND VMOS DYNAMIC MEMORY CELLS

[75] Inventors: Junichi Mogi, Kawasaki; Kiyoshi Miyasaka, Yokohama, both of Japan

[73] Assignee: Fujitsu Limited, Tokyo, Japan

[21] Appl. No.: 71,083

[22] Filed: Aug. 31, 1979

[30] Foreign Application Priority Data

Aug. 31, 1978 [JP] Japan ............................ 53-119700[U]

[51] Int. Cl.³ .................... H01L 27/02; H01L 29/06
[52] U.S. Cl. ........................................ 357/41; 357/23; 357/55
[58] Field of Search ........................... 357/23, 41, 55

[56] References Cited

U.S. PATENT DOCUMENTS

| | | | |
|---|---|---|---|
| 4,065,783 | 12/1977 | Ouyong | 357/41 |
| 4,084,175 | 4/1978 | Ouyang | 357/55 |
| 4,109,270 | 8/1978 | von Basse | 357/23 |
| 4,131,097 | 12/1978 | Ouyang | 357/42 |
| 4,173,765 | 11/1979 | Heald | 357/23 |
| 4,194,283 | 3/1980 | Hoffmann | 29/571 |

*Primary Examiner*—Martin H. Edlow
*Attorney, Agent, or Firm*—Staas and Halsey

[57] ABSTRACT

A semiconductor device has VMOS transistors and VMOS dynamic memory cells which are formed on the same semiconductor substrate of a first conductivity type. A buried layer of the opposite conductivity type is formed between the substrate and an epitaxial layer having V-grooves for the VMOS dynamic memory cells. In the buried layer are formed buried layers of the first conductivity type serving as sources and capacitors for the VMOS dynamic memory cells.

8 Claims, 3 Drawing Figures

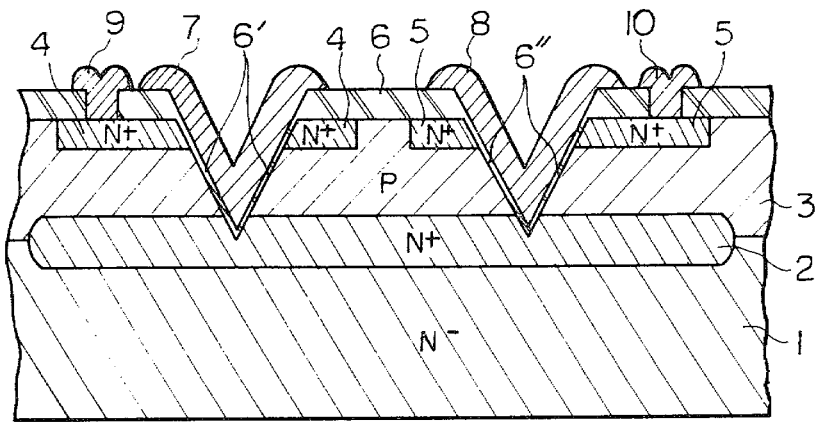
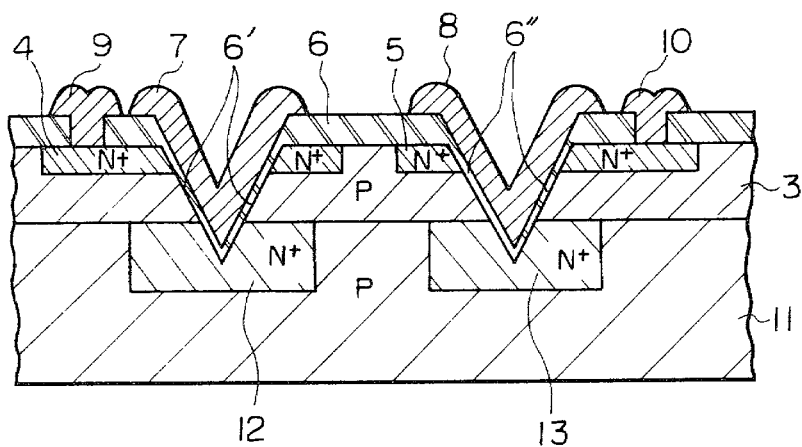

SEMICONDUCTOR DEVICES HAVING VMOS TRANSISTORS AND VMOS DYNAMIC MEMORY CELLS

BACKGROUND OF THE INVENTION

1. Field of the Invention

The present invention relates to semiconductor devices, and particularly to semiconductor devices having V-groove metal oxide semiconductor (VMOS) transistors and VMOS dynamic memory cells. It is most desirable to use the semiconductor devices according to the present invention for a random access memory (RAM).

2. Description of the Prior Art

A VMOS transistor has been produced by anisotropically etching a single-crystalline silicon semiconductor wafer with a (100) plane surface to form a V-groove and then forming a drain, a gate and a source along the slopes of the V-groove (see, for example, Fred B. Jenné: Electronics, Aug. 18, 1977, pp. 100–106).

FIG. 1 is a schematic cross-sectional view of ordinary n-channel VMOS transistors, in which two n-channel VMOS transistors are illustrated. The VMOS transistors are constructed as follows. A substrate 1 is made of a lightly-doped $n^-$-type silicon single-crystalline wafer. A heavily doped $n^+$-type buried layer 2 is formed in the substrate 1 by diffusion or ion implantation. The buried layer 2 serves as a common source of the VMOS transistors. A p-type silicon epitaxial layer 3 is formed on the buried layer 2 and the substrate 1. The surface of the epitaxial layer 3 is the (100) plane. Two V-grooves are formed by anisotropically etching the epitaxial layer 3 as illustrated in FIG. 1. The bottom peaks of the V-grooves reach into the buried layer 2. Around each of the V-grooves a heavily doped $n^+$-type region 4 or 5 is formed in a surface portion of the epitaxial layer 3 by ion implantation. The region 4 or 5 serves as a drain of each of the VMOS transistors. A thick silicon dioxide ($SiO_2$) layer 6 is formed on the epitaxial layer 3 by thermal oxidation. Thin silicon dioxide ($SiO_2$) layers, i.e., gate oxide layers, 6' and 6'' are formed on the surface of the V-grooves by thermal oxidation, respectively. Electron conductive layers, i.e. gate electrodes, 7 and 8 are formed on the thin silicon dioxide layers 6' and 6'', respectively. Finally, drain electrodes 9 and 10 are formed in suitable openings of the thick silicon dioxide layer 6 on the drain regions 4 and 5.

A one-transistor memory cell has been provided by combining a VMOS transistor with a buried junction capacitor. FIG. 2 is a schematic cross-sectional view of such one-transistor memory cells, i.e. VMOS dynamic memory cells, in which two one-transistor memory cells are illustrated. The memory cells are constructed as follows. A substrate 11 is made of a p-type silicon single-crystalline wafer. Heavily doped $n^+$-type buried layers 12 and 13 are formed in the p-type substrate 11 by diffusion or ion implantation. The reference numerals 3 through 10 indicate parts of the one-transistor memory cells which are the same as those indicated by the reference numerals 3 through 10 of FIG. 1. The bottom peaks of two V-grooves reach into the buried layers 12 and 13, respectively, as illustrated in FIG. 2. Each of the $n^+$-type buried layers 12 and 13 serves as a source of a VMOS transistor and a junction capacitor. Since each of the buried layers 12 and 13 has six sides available for storing a charge, the charge capacity of the buried layer is larger than that of a conventional dual-polysilicon type MOS memory cell. The gate electrodes 7 and 8 are connected to word lines (not shown in FIG. 2), respectively, and the drain electrodes 9 and 10 are connected to bit lines (not shown), respectively.

However, the above-mentioned VMOS transistors and one-transistor memory cells (i.e. VMOS dynamic memory cells) can not be formed on the same silicon single-crystalline substrate, since the conductivity type of the substrate used in the VMOS transistors is different from that of the substrate used in the memory cells.

SUMMARY OF THE INVENTION

It is an object of the present invention to provide a semiconductor device having VMOS transistors and VMOS dynamic memory cells which are formed on the same semiconductor substrate.

It is another object of the present invention to increase the density of a RAM by combining VMOS dynamic memory cells and VMOS transistors.

The above-mentioned and other objects are attained with a semiconductor device comprising: a single-crystalline semiconductor substrate of a first conductivity type; a semiconductor epitaxial layer of the opposite conductivity type formed on the substrate, the epitaxial layer having V-grooves for VMOS transistors and VMOS dynamic memory cells and having heavily doped regions of the first conductivity type adjacent the V-grooves at the surface portion of the epitaxail layer; an oxide layer formed on the surfaces of the V-grooves and epitaxial layer; electrode layers formed on the oxide layer in the V-grooves; a first heavily doped region of the one conductivity type formed in a surface portion of the substrate, bottom peaks of the V-grooves of the VMOS transistors reaching to the first heavily doped region; and second heavily doped regions of the first conductivity type formed in a heavily doped region of the opposite conductivity type which is formed in a surface portion of the substrate, each bottom peak of the V-grooves of the VMOS dynamic memory cells reaching to a separate one of said second heavily doped regions.

The present invention will be further explained by means of the description of the preferred embodiment of the present invention set forth below with reference to the accompanying drawings.

BRIEF DESCRIPTION OF THE DRAWINGS

FIG. 1 is a schematic cross-sectional view of conventional VMOS transistors;

FIG. 2 is a schematic cross-sectional view of conventional VMOS dynamic memory cells.

DETAILED DESCRIPTION OF THE INVENTION

Figure 3:
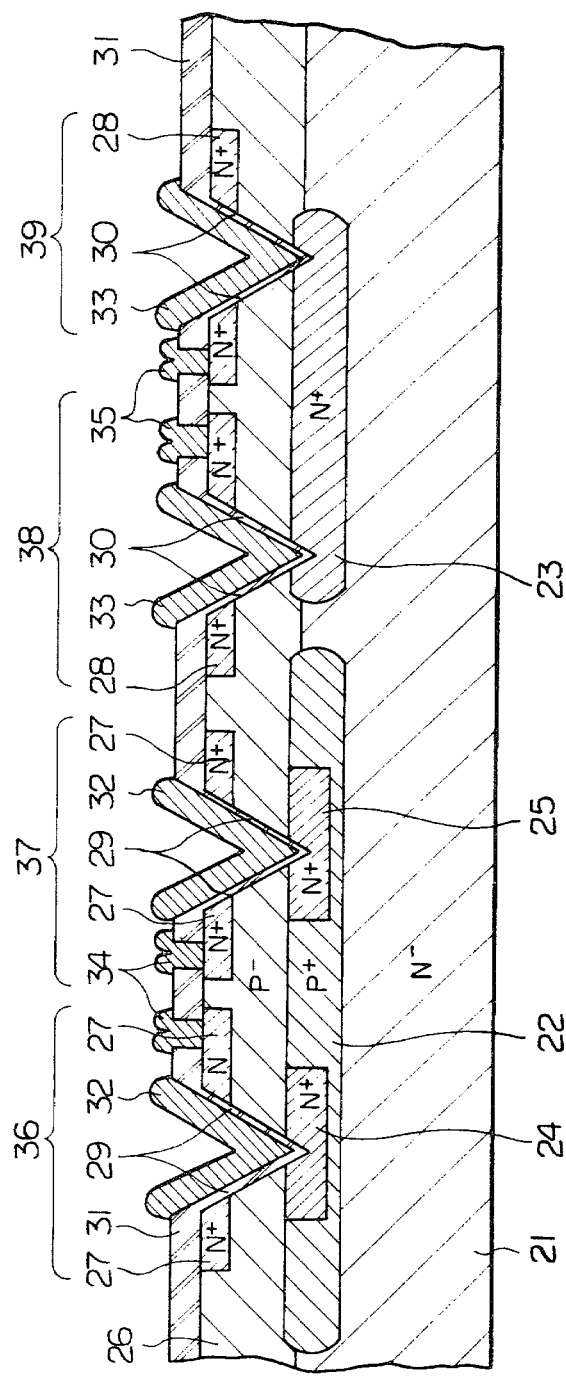
FIG. 3 is a schematic cross-sectional view of a semiconductor device having VMOS transistors and VMOS dynamic memory cells according to the present invention.

Referring now to FIG. 3, a preferred construction of a semiconductor device according to the present invention is carried out as follows. A semiconductor substrate 21 is made of a lightly-doped $n^-$-type silicon single-crystalline wafer with the (100) plane surface. A heavily doped $p^+$-type buried layer 22 is formed in a surface portion of the substrate 21 for the VMOS dynamic memory cells. Heavily doped $n^+$-type buried layers 23, 24 and 25 are simultaneously formed in a surface portion of the substrate 21 and in the $p^+$-type buried layer 22. If the substrate 21 is a heavily doped n+-type silicon single-crystalline wafer, the above-mentioned buried layer 23 is unnecessary. Each of the n+-type buried layers 24 and 25 serves as a source of a VMOS transistor and of a junction capacitor. A lightly-doped p−-type silicon epitaxial layer 26 is formed on all of the buried layers 22, 23, 24 and 25, and the substrate 21. Since the surface of the epitaxial layer 26 is the (100) plane, this allows the four V-grooves to be formed by anisotropically etching the epitaxial layer 26 as illustrated in FIG. 3. The bottom portions of the V-grooves reach into the n+-type buried layers 23, 24 and 25 in the substrate 21. Heavily doped n+-type regions 27 and 28, serving as drains of MOS transistors, are formed around the V-grooves in the surface portions of the epitaxial layer 26. Thin silicon dioxide layers 29 and 30, serving as gate oxide layers, are formed on the surfaces of the V-grooves. A thick silicon dioxide layer 31, serving as a protecting layer, is formed on the epitaxial layer 26. Conductive layers 32 and 33, made of conductive polysilicon or aluminum metal and serving as gate electrodes of MOS transistors, are formed on the thin silicon dioxide layers 29 and 30 in the V-grooves. Finally, other conductive layers 34 and 35, serving as drain electrodes of the MOS transistors, are formed in suitable openings of the thick silicon dioxide layer 31 on the drain regions 27 and 28. Accordingly, in the case of FIG. 3, two VMOS dynamic memory cells 36 and 37, and two VMOS transistors 38 and 39 are produced on the same substrate 21.

The semiconductor device according to the present invention will be more apparent from the following example of the production of the semiconductor device.

EXAMPLE

A lightly-doped n−-type silicon single-crystalline wafer having the (100) plane surface and a resistivity of 10 Ω-cm was used as a semiconductor substrate. A heavily doped p+-type buried layer was formed in a surface portion of the substrate by conventional selective ion implantation of boron for VMOS dynamic memory cells. Heavily doped n+-type buried layers were formed in a surface portion of the substrate for the VMOS transistor and in the p+-type buried layer by conventional selective ion implantation of phosphorus.

Then, a lightly doped p−-type silicon epitaxial layer having a thickness of 1.5 μm was grown on the entire surface of the substrate, including the p+-type buried layers. A silicon dioxide layer having a thickness of 300 Å was formed on the silicon epitaxial layer by thermal oxidation of silicon at a temperature 1000° C. A silicon nitride layer having a thickness of 500 Å was formed on the silicon dioxide layer by chemical vapor deposition (CVD). The silicon nitride and silicon dioxide layers were selectively etched to exposed drain region parts of the epitaxial layer by conventional photolithography. Arsenic ions were implanted into the exposed drain region parts to form heavily doped n+-type regions serving as drains of MOS transistors. After the arsenic ion implantation, conventional thermal oxidation was carried out to form silicon dioxide layers having a thickness of 4000 Å on the drain region parts of the epitaxial layer.

The remaining silicon nitride layers and the underlying silicon dioxide layers were removed by etching to expose parts of the epitaxial layer for formation of V-grooves. The exposed parts of the epitaxial layer with the (100) plane surface were anisotropically etched to form V-grooves, i.e. pyramid holes. The bottom portions of the V-grooves reached into the n+-type buried layers in the substrate. Then, silicon dioxide layers, i.e. gate oxide layers, having a thickness of 1000 Å were formed on the surfaces of the V-grooves by thermal oxidation of the silicon. The silicon dioxide layers on the V-grooves combined with the silicon dioxide layer on the epitaxial layer to make one silicon dioxide layer. On this silicon dioxide layer a conductive polysilicon layer was formed by conventional chemical vapor deposition and, then, etched by photolithography to leave predetermined parts of it, including parts serving as gate electrodes, in the V-grooves. Finally, predetermined metal lines and drain electrodes were made of aluminum by conventional vacuum evaporation and photolithography. Accordingly, a desired number of VMOS transistors and VMOS dynamic memory cells were simultaneously formed on the same n−-type single-crystalline substrate as illustrated in FIG. 3.

It will be obvious that the present invention is not restricted to the above-described embodiment and example, and that many variations are possible for those skilled in the art without departing from the scope of the present invention. For example, in the embodiment and example the one conductivity type is n-type, but it may be p-type. Also in the embodiment and example the p+-type buried layer is formed as a common region, but for each of the VMOS dynamic memory cells independent p+-type buried layers surrounding the n+-type buried layers, respectively, may be formed. Furthermore, if necessary, channel stoppers can be formed for the VMOS transistors and VMOS dynamic memory cells.

What is claimed is:

1. A semiconductor device which has V-groove metal oxide semiconductor (VMOS) transistors and VMOS dynamic memory cells, comprising:
    a lightly doped semiconductor single-crystalline substrate of a first conductivity type;
    a semiconductor epitaxial layer of the opposite conductivity type formed selectively on said substrate, said epitaxial layer having V-grooves for the VMOS transistors and the VMOS dynamic memory cells and having heavily doped regions of the first conductivity type adjacent said V-grooves at the surface portions of said epitaxial layer;
    an oxide layer formed on said V-grooves and epitaxial layer;
    electrode layers formed on said oxide layer in said V-grooves;
    a first heavily doped region of the first conductivity type formed in a first surface portion of said substrate, the bottom peaks of said V-grooves of said VMOS transistors reaching to said first heavily doped region; and
    second heavily doped regions of the first conductivity type formed in a third heavily doped region of the opposite conductivity type, said third heavily doped region being formed in a second surface portion of said substrate, each bottom peak of said V-grooves of said VMOS dynamic memory cells reaching to a separate one of said second heavily doped regions 2. A semiconductor device which has V-groove metal oxide semiconductor (VMOS) transistors and VMOS dynamic memory cells, comprising:
    a doped semiconductor single-crystalline substrate of a first conductivity type;

a semiconductor epitaxial layer of the opposite conductivity type formed selectively on said substrate, said epitaxial layer having V-grooves for the VMOS transistors and the VMOS dynamic memory cells and having heavily doped regions of the first conductivity type adjacent said V-grooves at the surface portions of said epitaxial layer;

an oxide layer formed on said V-grooves and epitaxial layer;

electrode layers formed on said oxide layer in said V-grooves; and at least one heavily doped region of the first conductivity type formed in a heavily doped region of the opposite conductivity type which is formed in a surface portion of said substrate, each bottom peak of said V-grooves of said VMOS dynamic memory cells reaching to a separate one of said heavily doped regions of said first conductivity type.

3. A semiconductor device according to claim 1 or 2, wherein said semiconductor single-crystalline substrate comprises silicon.

4. A semiconductor device according to claim 1 or 2, wherein said semiconductor epitaxial layer comprises silicon.

5. A semiconductor device according to claim 1 or 2, wherein said semiconductor single-crystalline substrate and said epitaxial layer comprises silicon and the surface of said semiconductor epitaxial layer in the (100) plane.

6. A semiconductor device according to claim 1 or 2, wherein said oxide layer comprises silicon dioxide.

7. A semiconductor device according to claim 1 or 2, wherein said electrode layers in said V-grooves comprises conductive polysilicon.

8. A semiconductor device according to claim 1 or 2, wherein said electrode layers in said V-grooves comprise aluminum metal.

* * * * *

UNITED STATES PATENT AND TRADEMARK OFFICE
CERTIFICATE OF CORRECTION

PATENT NO. : 4,250,519
DATED : February 10, 1981
INVENTOR(S) : Junichi Mogi et al.

It is certified that error appears in the above—identified patent and that said Letters Patent is hereby corrected as shown below:

Cover sheet, item [73], "Tokyo" should be --- Kanagawa ---.

*Signed and Sealed this*

*Twenty-fourth* Day of *November 1981*

[SEAL]

Attest:

GERALD J. MOSSINGHOFF

*Attesting Officer*     *Commissioner of Patents and Trademarks*